(12) United States Patent
Sasai et al.

(10) Patent No.: US 11,908,969 B2
(45) Date of Patent: Feb. 20, 2024

(54) METHOD OF RECOVERING VALUABLE MATERIALS FROM PHOTOVOLTAIC MODULE

(71) Applicant: Tokuyama Corporation, Shunan (JP)

(72) Inventors: Masaru Sasai, Tokyo (JP); Yuichiro Minabe, Tokyo (JP)

(73) Assignee: Tokuyama Corporation, Shunan (JP)

( * ) Notice: Subject to any disclaimer, the term of this patent is extended or adjusted under 35 U.S.C. 154(b) by 581 days.

(21) Appl. No.: 17/266,249

(22) PCT Filed: Jul. 19, 2019

(86) PCT No.: PCT/JP2019/028486
§ 371 (c)(1),
(2) Date: Feb. 5, 2021

(87) PCT Pub. No.: WO2020/031661
PCT Pub. Date: Feb. 13, 2020

(65) Prior Publication Data
US 2021/0305450 A1    Sep. 30, 2021

(30) Foreign Application Priority Data

Aug. 6, 2018  (JP) .................. 2018-147407

(51) Int. Cl.
*H01L 31/18* (2006.01)
*C08J 11/12* (2006.01)

(52) U.S. Cl.
CPC .............. *H01L 31/18* (2013.01); *C08J 11/12* (2013.01); *C08J 2387/00* (2013.01)

(58) Field of Classification Search
CPC ........ H01L 31/18; C08J 11/12; C08J 2387/00

USPC ......................................................... 156/711
See application file for complete search history.

(56) References Cited

U.S. PATENT DOCUMENTS

| 9,455,367 B2 | 9/2016 | Lee et al. |
| 2007/0179332 A1* | 8/2007 | Madar ..................... C10B 53/00 |
| | | 588/321 |
| 2015/0090406 A1 | 4/2015 | Lee et al. |

FOREIGN PATENT DOCUMENTS

| CN | 106847368 A | 6/2017 |
| JP | H11165150 A | 6/1999 |
| JP | 2007059793 A | 3/2007 |
| JP | 2012019131 A | 1/2012 |
| JP | 2012019134 A | 1/2012 |

(Continued)

OTHER PUBLICATIONS

Kobunshi Ronbunshu, Sep. 2007, pp. 583-589, vol. 64, No. 9.

*Primary Examiner* — James D Sells
(74) *Attorney, Agent, or Firm* — The Webb Law Firm

(57) ABSTRACT

Provided is a method to recycle valuable materials included in a photovoltaic module having a resin back sheet or the like, for efficiently and easily recovering the valuable materials by removing the resin components from the photovoltaic module. The method of recovering valuable materials from a photovoltaic module, includes: a loading step of loading a photovoltaic module (X) having a resin back sheet and a sealing resin layer on a heat-resistant porous molded body (A) with the back sheet surface facing down; and a heating step of heating a load including the photovoltaic module (X) and the porous molded body (A) in a heating furnace in an oxidizing atmosphere to melt and then combust the resin components.

5 Claims, 3 Drawing Sheets

(56) References Cited

FOREIGN PATENT DOCUMENTS

| | | | |
|---|---|---|---|
| JP | 2013146649 | A | 8/2013 |
| JP | 2014024037 | A | 2/2014 |
| JP | 2014108375 | A | 6/2014 |
| JP | 2015071162 | A | 4/2015 |
| JP | 2016093804 | A | 5/2016 |
| JP | 2016172246 | A | 9/2016 |
| JP | 2016190177 | A | 11/2016 |
| JP | 2018020267 | A | 2/2018 |
| WO | 2017091782 | A1 | 6/2017 |

\* cited by examiner

[Fig. 1]
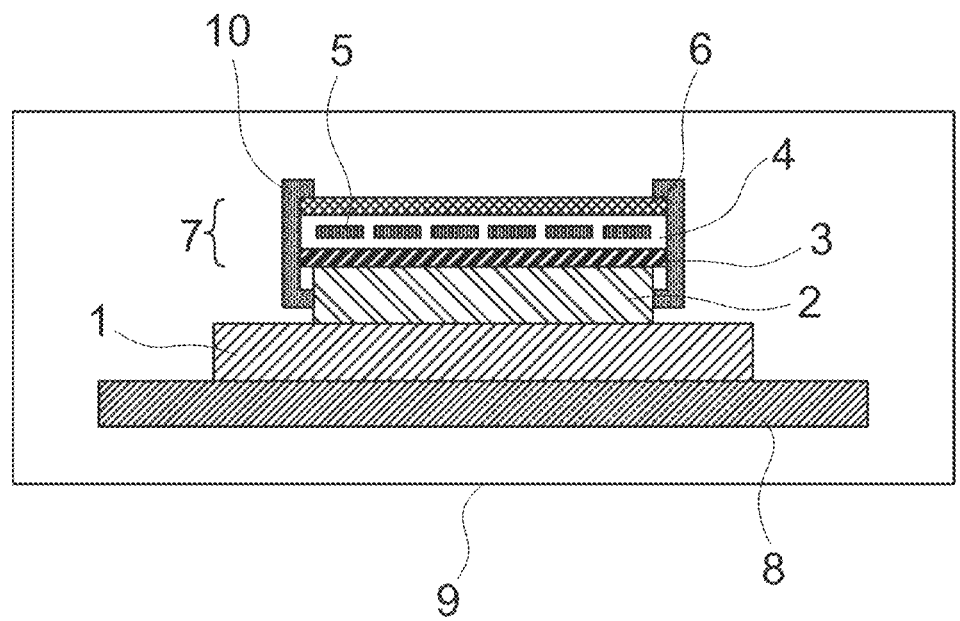
[Fig. 2]
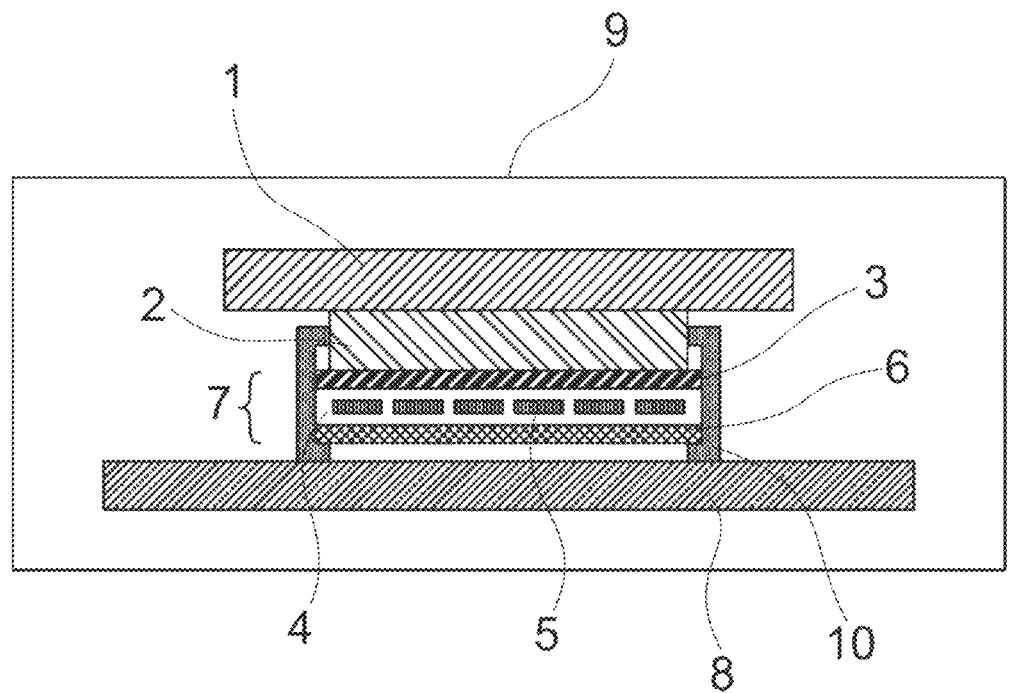

[Fig. 3]
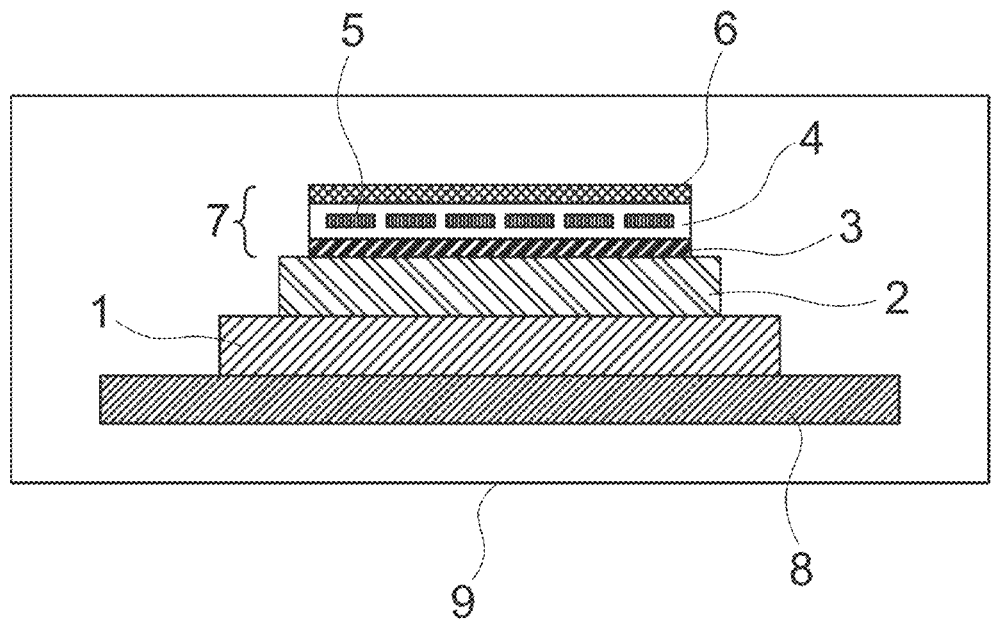
[Fig. 4]
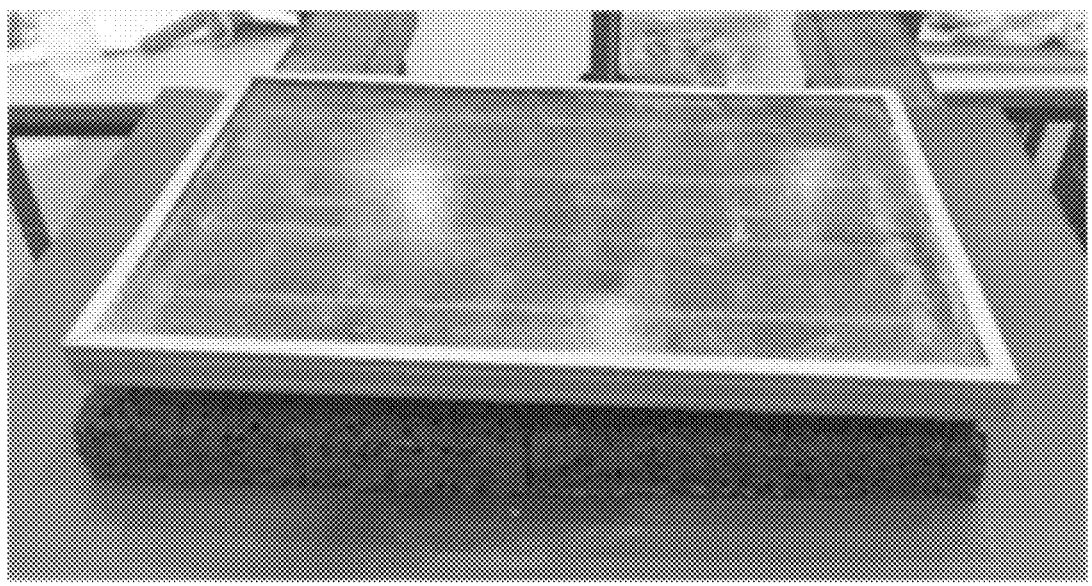

[Fig. 5]
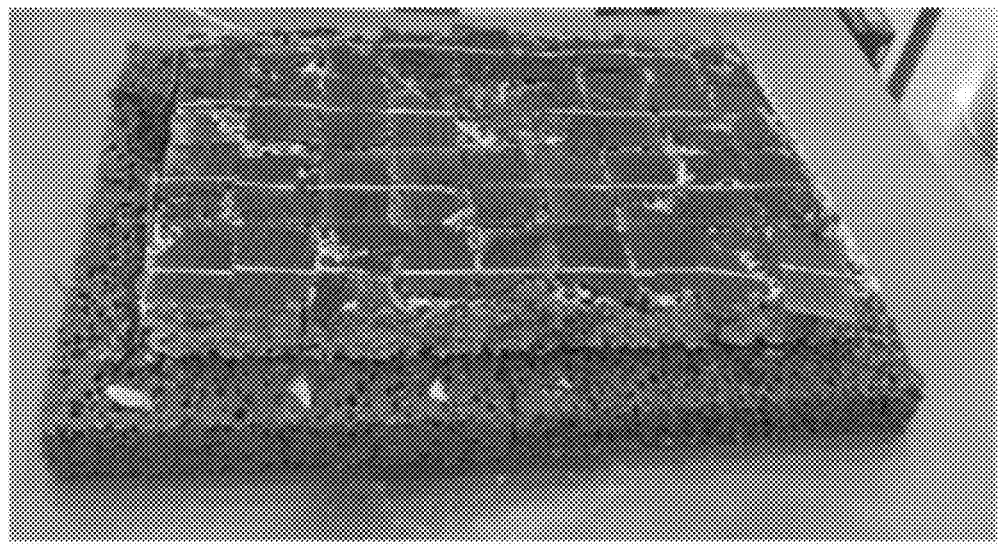
[Fig. 6]
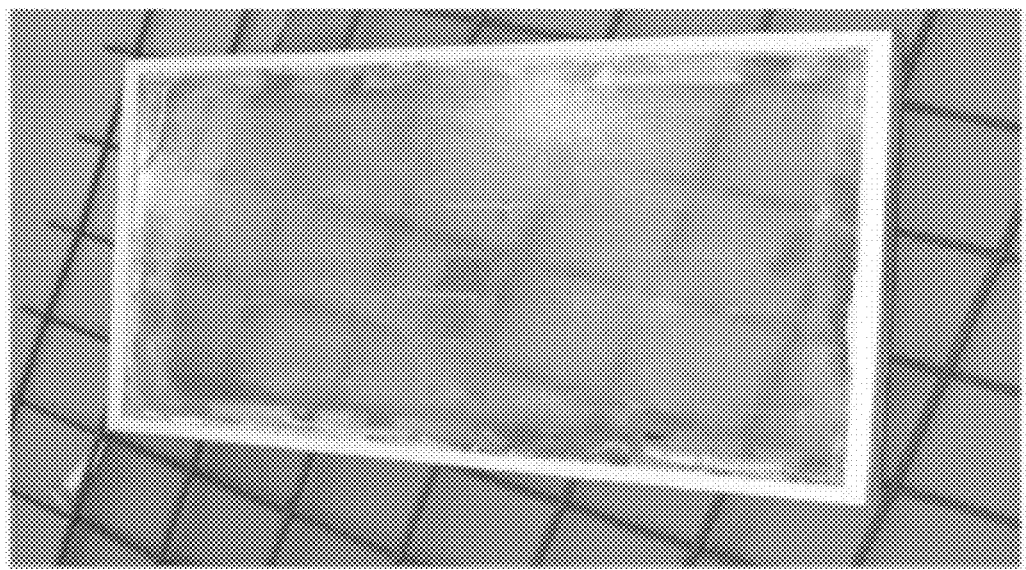

METHOD OF RECOVERING VALUABLE MATERIALS FROM PHOTOVOLTAIC MODULE

CROSS-REFERENCE TO RELATED APPLICATIONS

This application is the United States national phase of International Application No. PCT/JP2019/028486 filed Jul. 19, 2019, and claims priority to Japanese Patent Application No. 2018-147407 filed Aug. 6, 2018, the disclosures of which are hereby incorporated by reference in their entirety.

TECHNICAL FIELD

The present invention relates to a method of removing resin components such as a back sheet and a sealing resin layer from a photovoltaic module and separating the battery into glass, cell, silver, aluminum frame, and the like to recover valuable materials.

BACKGROUND ART

Toward the realization of a low-carbon society, the acceleration of $CO_2$ reduction by utilizing renewable energy such as solar power generation is about to progress. While the introduction of solar power generation has progressed significantly, the issue of recycling when disposing of photovoltaic modules has been pointed out.

The structure of a general photovoltaic module is made of three layers: tempered glass on the front surface, a sealing resin layer on the inside, and a back sheet on the back surface. An electric wire (interconnector) connecting the photovoltaic cells is wired in the sealing resin layer. The sealing resin is required to have transparency, flexibility, adhesiveness, tensile strength, weather resistance, etc., and an ethylene-vinyl acetate copolymer (hereinafter abbreviated as "EVA") is generally used. It serves to bond the tempered glass, cell, and back sheet by heating and pressurizing. When this photovoltaic module is heated in an electric furnace or the like in an oxidizing atmosphere, EVA is melted at 80 to 120° C., a deacetylation reaction of EVA occurs at around 350° C., and a thermal decomposition reaction of the polyethylene part, which is the main chain, occurs rapidly at around 450° C. A technique of thermally decomposing a photovoltaic module to recycle it as described above is disclosed (see Patent Literatures JP H11-165150 A and JP 2007-59793 A).

However, since the thermal decomposition reaction at around 450° C. occurs explosively, thermal decomposition of a photovoltaic module with a size of about 1 m×2 m may cause a fire and is not suited for large-scale operation. In order to solve this technical problem, a method has been proposed, the method including: a preheating step of heating a photovoltaic panel to 100 to 200° C.; and a main heating step of heating the photovoltaic panel to a higher temperature than the preheating step by using superheated steam, thereby removing the resin material, and dropping and separating the photovoltaic cell and the wiring member from the glass plate (see JP 2014-24037 A).

In addition, a method for recovering a photovoltaic element constituent material has been disclosed, the method including a step of transferring a photovoltaic element to a continuous heat treatment furnace in which the oxygen concentration in the furnace is maintained at 1.0% by volume or more and 3.0% by volume or less; releasing and removing acetic acid gas, which is a kind of EVA decomposition gas, in a preheating decomposition section set to 300 to 400° C.; and then desorbing the EVA decomposition gas other than acetic acid in a heat treatment section set to 400 to 550° C., thereby removing the EVA sealing material from the photovoltaic element and separating the cell section and the glass substrate (see JP 2014-108375 A).

Furthermore, a method in which, by placing a photovoltaic module on a breathable support carrying an oxide semiconductor with the light receiving surface facing up, the oxide semiconductor is brought into contact with the back sheet of the photovoltaic module, and in the presence of oxygen, by heating the object to be treated at a temperature where the oxide semiconductor is in the intrinsic conduction region, the polymer in the object to be treated is decomposed and removed, thereby recovering valuable materials from the disassembled object (see JP 2016-93804 A), and a method in which the back sheet of a photovoltaic panel is brought into contact with an oxide semiconductor, with the outer frame of the photovoltaic panel still attached, and in the presence of oxygen, by heating the object to be treated at a temperature where the oxide semiconductor is in the intrinsic conduction region, the polymer in the object to be treated is decomposed and removed, thereby recovering valuable materials from the disassembled object (see JP 2016-190177 A) have been proposed.

SUMMARY OF INVENTION

Technical Problem

In the methods presented in Patent Literatures JP 2014-24037 A and JP 2014-108375 A, in order not to cause a rapid combustion reaction, the resin components such as EVA are thermally decomposed in two stages at a low oxygen concentration. However, it cannot be said that these methods are easy because controlling the oxygen concentration and temperature in the furnace is complicated and requires a great deal of skill for operation.

In addition, in the early days when these patents were filed, the back sheet material for solar batteries was mostly weather-resistant polyvinyl fluoride (hereinafter abbreviated as "PVF"), but today cheaper polyethylene terephthalate (hereinafter abbreviated as "PET") has become the mainstream. Also, single-layer PET, and two- and three-layer back sheets in which PET is laminated with a fluoropolymer including PVF or polyvinylidene fluoride (hereafter abbreviated "PVDF") such as PVF/PET, PVDF/PET, PVF/PET/PVF, and PVDF/PET/PVDF are widely used, and most back sheets use PET.

Fluororesins such as PVF and PVDF are thermally decomposed at about the same temperature as EVA, and therefore, conventional thermal decomposition methods do not pose a problem, whereas PET is melted at 250° C. and begins to be thermally decomposed at around 400° C., and has benzene rings and ester groups, and thus undergoes a wide range of thermal decomposition reactions. Carbides in which benzene rings are complicatedly bonded to each other may be formed as a byproduct, resulting in the formation of black "soot", and once "soot" is attached to glass, it is difficult to reuse the glass. It has also been reported that 9% of the residual amount of this "soot" remains even when combusted at 850° C. (see Non Patent Literature: Japanese Journal of Polymer Science and Technology, Vol. 64., No. 9 (2007)).

Therefore, with the above two techniques in which the oxygen concentration is lowered, even though EVA can be thermally decomposed, PET is not thermally decomposed completely. Therefore, when a photovoltaic module using the PET back sheet is heat-treated, it is fully covered with "soot", and at the same time, inorganic powders such as titanium oxide and calcium carbonate included in the back sheet also remain, so that more advanced separation technique has been needed to recycle valuable materials.

Also, in the techniques proposed in Patent Literatures JP 2016-93804 A and JP 2016-190177 A, since the oxide semiconductor needs to be brought into contact with the back sheet, the oxide semiconductor is mixed in the cell after thermal decomposition, and a step of separating the oxide semiconductor from the cell is required. Furthermore, since fillers such as titanium oxide and calcium carbonate included in the back sheet adhere to the oxide semiconductor, these techniques are still insufficient to reuse the breathable support supporting the oxide semiconductor over and over again.

Based on the above, an object of the present invention is to provide a method for efficiently and easily recovering the valuable materials included in a photovoltaic module having a resin back sheet or the like, by removing the resin components from the photovoltaic module in order to recycle valuable materials.

Solution to Problem

The present inventors have conducted diligent studies to solve the above problems. As a result, the present inventors have found that valuable materials can be efficiently and easily recovered not by lowering the oxygen concentration in the heating furnace in order to suppress the rapid combustion of EVA included in the photovoltaic module, but by combusting the resin components slowly and stably to remove it, and have completed the present invention.

That is, the present invention relates to a method of recovering valuable materials from a photovoltaic module (X) having a resin back sheet and a sealing resin layer, the method including: a loading step of loading the photovoltaic module (X) on a heat-resistant porous molded body (A) with the back sheet surface facing down; and a heating step of heating a load including the photovoltaic module (X) and the porous molded body (A) in a heating furnace in an oxidizing atmosphere to melt and then combust the resin components.

Advantageous Effects of the Invention

In the present invention, the resin components such as EVA and PET, which have been melted before ignition, permeate into the heat-resistant porous molded body to expand their surface areas and are gently combusted like a candle flame, thus avoiding a rapid combustion reaction and allowing them to be combusted stably. In the conventional technique, the tempered glass is broken when the photovoltaic module is thermally decomposed, but by subjecting it to gentle flaming combustion, the tempered glass can be recovered as it is without cracking.

In addition, by arranging a heat-resistant material carrying a transition metal oxide in the furnace, generation of "soot" when combusting an aromatic resin such as PET can be suppressed, and valuable materials that can be reused in the photovoltaic module can be easily recovered.

BRIEF DESCRIPTION OF THE DRAWINGS

FIG. 1 is a schematic view illustrating an embodiment of the present invention.

FIG. 2 is a schematic view of Comparative Example 4 in which a porous molded body (A) is arranged on a photovoltaic module (X) with a back sheet surface facing up.

FIG. 3 is a schematic view illustrating an aspect of the present invention (without aluminum frame).

FIG. 4 is a photograph showing an embodiment of the present invention (photovoltaic module after combustion).

FIG. 5 is a photograph showing an embodiment of the present invention (photovoltaic module after combustion (excluding tempered glass and aluminum frame)).

FIG. 6 is a photograph showing an embodiment of the present invention (tempered glass and aluminum frame after combustion).

DESCRIPTION OF EMBODIMENTS

Hereinafter, the present invention will be described in detail.

A method of recovering valuable materials from a photovoltaic module according to the present invention is characterized by including: a loading step of loading a photovoltaic module (X) having a resin back sheet and a sealing resin layer on a heat-resistant porous molded body (A) with the back sheet surface facing down; and a heating step of heating a load including the photovoltaic module (X) and the porous molded body (A) in a heating furnace in an oxidizing atmosphere to melt and then combust the resin components. The valuable materials are at least one selected from the group consisting of glass, cell, silver, aluminum frame, and the like.

Note that the silver is derived from, for example, an electrode or the like.

<Photovoltaic Module (X)>

For the photovoltaic module (X) applicable to the present invention, any photovoltaic module can be utilized as long as it is not of the double-sided glass type and has a resin back sheet. Specific examples thereof include single crystal silicon solar batteries, polycrystalline silicon solar batteries, amorphous silicon solar batteries, heterojunction solar batteries, CIS solar batteries, CIGS solar batteries, and CdTe solar batteries. For the aluminum frame of the photovoltaic module (X), since it is not necessary to cut the porous molded body (A) in accordance with the size of the aluminum frame and the work becomes easier, the aluminum frame may be removed before thermal decomposition, or it may be removed after thermal decomposition in order to reduce the possibility of the glass breaking during removal.

<Porous Molded Body (A)>

For the heat-resistant porous molded body (A) applicable to the present invention, anything can be used without limitations as long as it is stable at a combustion temperature (specifically, about 425° C. to 575° C.), which will be described later, and has a porous structure. Specific examples of the material thereof include stable and common ceramic materials such as alumina, zirconia, silicon nitride, silicon carbide, cordierite, ferrite, barium titanate, lead zirconate titanate, forsterite, zircon, mullite, steatite, and aluminum nitride.

The pore size of the porous material is not particularly limited, but it is suitably about 0.1 to 5 mm, into which EVA, PET, and the like easily permeate when they are melted at around 450° C. The number of cells on the surface is not particularly limited, either, but 5 to 50 pixels per inch (hereinafter abbreviated as "ppi") are desirable. There is no limitation on the porosity, either, but it is preferably about 50 to 95%. In particular, one having a three-dimensional skeleton structure with continuous pores can be suitably used.

Also, the shape of the porous molded body (A) is not particularly limited, but since the resin used in the photovoltaic module is arranged so as not to fall, a plate-shaped one can be suitably used. Furthermore, from the viewpoint that the occurrence of "soot" due to leakage of melted resin components outside of the porous molded body (A) can be suppressed, the size (area) of the surface of the porous molded body (A) on which the back sheet is loaded is preferably as large as possible within the range that it can fit within the aluminum frame when the aluminum frame is not removed (see FIG. 1), and when the aluminum frame is removed from the photovoltaic module (X), it is preferably larger than the bottom area of the back sheet (see FIG. 3).

There is no limitation on the thickness of the porous molded body (A), but one having a thickness of about 10 to 60 mm is suitable.

As the porous molded body (A) as described above, a product called a ceramic foam, ceramic filter, or ceramic foam filter, which are made of alumina, silicon carbide, and cordierite is suitable.

In the loading step, the photovoltaic module (X) is loaded on the porous molded body (A) with the back sheet surface facing down. By allowing the back sheet surface to face down, the resin components constituting the back sheet and the sealing resin layer are melted by heating, and then flow out toward the porous molded body (A) by the action of gravity.

As the name suggests, the porous molded body (A) is porous, so that the resin that has flowed down has a large contact area with the atmosphere in the heating furnace. Therefore, the efficiency of combustion due to further heating is increased, and the generation of "soot" can be suppressed.

For the combustion, the atmosphere in the heating furnace in the heating step is oxidizing. Here, the oxidizing atmosphere is an atmosphere having an oxygen concentration of 15% or more. The upper limit of the oxygen concentration is not particularly limited, but a case of 25% or less is preferable because rapid combustion can be suppressed. Generally, an air atmosphere is acceptable.

The combustion in the present invention is an oxidation reaction in which organic substances such as EVA and PET included in the back sheet, the sealing resin layer and the like constituting the photovoltaic module (X) react with oxygen in the atmosphere. The combustion is flaming combustion.

Therefore, the combustion temperature is appropriately determined depending on the resin constituting the back sheet, but is preferably 425 to 575° C. When the temperature is 425° C. or higher, it is higher than the thermal decomposition temperatures of EVA and PET, and flaming combustion occurs. Furthermore, when the temperature is 575° C. or lower, rapid combustion can be suppressed and the glass of the photovoltaic module (X) can be prevented from being damaged.

Note that the melting starts to occur at a temperature lower than the combustion temperature. In order to obtain the combustion temperature, it is common to raise the temperature from room temperature, and the melting temperature can be obtained during this temperature raising process. The temperature raising rate may be generally 5° C./min to 150° C./min, and particularly 20° C./min to 150° C./min.

The heating in the heating step should be performed in the heating furnace in consideration of the treatment of exhaust gas and the like. The heating furnace is not particularly limited as long as it is a heating furnace such as a gas furnace or an electric furnace by which the combustion temperature can be obtained and the photovoltaic module (X) can be loaded on the porous molded body (A) with the back sheet surface facing down, and a known heating furnace can be used.

<Heat-Resistant Material (B)>

In the present invention, it is preferable to arrange a heat-resistant material (B) carrying a transition metal oxide in the heating furnace. Transition metal oxides have the ability to adsorb oxygen when in the oxidized state and to decompose carbon monoxide and "soot" produced during combustion. For example, chromium(III) oxide is in the reduced state at room temperature and has a bright green color, but when heated to 400° C. or higher in the presence of oxygen, it adsorbs oxygen and changes its color to black-green, which is in the oxidized state. It is known that this discolored chromium(III) oxide can oxidatively decompose carbon monoxide (CO) into carbon dioxide ($CO_2$).

In order to reduce CO in waste gas, the present inventors coated a porous molded body similar to the aforementioned porous molded body (A) (for example, a ceramic filter) with chromium(III) oxide and placed it in a furnace, and found that not only was CO reduced in the waste gas, but also "soot", which adheres to the ceramic filter, was rarely produced. It was found that this phenomenon also occurs in iron(III) oxide, copper(II) oxide, titanium(IV) oxide, and the like.

From the above, when at least a part of the resin constituting the back sheet is an aromatic resin such as PET (a resin having an aromatic group as a part of the repeating unit), from the viewpoint that the occurrence of "soot" can be suppressed, it is suitable to allow the transition metal oxide to be present in the furnace.

As the transition metal oxide, oxides of, for example, scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, gold, and mercury can be used without any limitations.

Among the above, preferable examples include oxides of first transition elements including scandium, titanium, vanadium, chromium, manganese, iron, cobalt, nickel, and copper; oxides of second transition elements including yttrium, zirconium, niobium, molybdenum, technetium, ruthenium, rhodium, palladium, and silver; and oxides of third transition elements including lanthanum, cerium, praseodymium, neodymium, promethium, samarium, europium, gadolinium, terbium, dysprosium, holmium, erbium, thulium, ytterbium, lutetium, hafnium, tantalum, tungsten, rhenium, osmium, iridium, platinum, and gold, and more preferably, transition metal oxides such as rutile or anatase type titanium(IV) oxide, chromium(III) oxide, iron(III) oxide, and copper(II) oxide can be suitably utilized. These may be in the state of composite oxides.

In order to increase the contact area, it is suitable for the transition metal oxide to be supported on the heat-resistant material (B) and be present in the furnace. The heat-resistant material (B) may be any material as long as it is stable at the combustion temperatures of the resin components as in the porous molded body (A), and the same material may be used. The shape of the heat-resistant material (B) is not particularly limited, and is not particularly limited as long as it can be used as a so-called catalyst carrier. However, it is preferably a porous material in order to increase the contact area with CO and "soot", and is more preferably a porous molded body that is similar to the porous molded body (A) on which the photovoltaic module (X) is laminated.

As a method for having a heat-resistant material carry the transition metal oxide used in the present invention, a known technique can be used without any limitations. Specifically, a method of impregnating a heat-resistant material in a solution including the transition metal oxide by using dip coating, wash coating, spray coating, spin coating, or the like and having it carry the transition metal oxide is common. After that, the simplest method is to remove the solution by heating the heat-resistant material to the boiling point of the solution or higher. Alternatively, a thermal spraying technique in which a melted transition metal oxide is sprayed onto a heat-resistant material may be utilized.

<<Aspects of Arranging the Heat-Resistant Material (B)>>

In the present invention, the aspect of arranging the heat-resistant material (B) carrying the transition metal oxide is not particularly limited, and examples thereof include the following aspects.

The first aspect is to arrange the heat-resistant material (B) carrying the transition metal oxide in the vicinity of the porous molded body (A) on which the photovoltaic module (X) is loaded. At this time, since the distance between the transition metal oxide and the CO and "soot" generated in the porous molded body (A) becomes short, the CO and "soot" can be efficiently decomposed. In this case, in view of the ease of installation, an aspect in which the heat-resistant material (B) carrying the transition metal oxide is also a porous molded body and the porous molded body (A) and the heat-resistant material (B) are loaded is preferable.

The second aspect is a method of arranging the heat-resistant material (B) carrying the transition metal oxide along the inner wall in the heating furnace. Also in this case, it is preferable that the heat-resistant material (B) carrying the transition metal oxide is also a porous molded body in view of increasing the contact area.

The third aspect is a method of arranging the heat-resistant material (B) carrying the transition metal oxide in the vicinity of the porous molded body (A) on which the photovoltaic module (X) is loaded and along the inner wall in the heating furnace. Also in this case, it is preferable that the heat-resistant material (B) carrying the transition metal oxide is also a porous molded body in view of increasing the contact area.

Note that an aspect in which the heat-resistant material (B) carrying the transition metal oxide is not in direct contact with the photovoltaic module (X) is preferable, and in particular, an aspect in which the heat-resistant material is arranged below the photovoltaic module (X) so that it does not come into direct contact with the module is more preferable. This is because the heat-resistant material (B) is less likely to be contaminated by non-combustible components such as fillers included in the back sheet or the like of the photovoltaic module (X), and when the heat-resistant material (B) carrying the transition metal oxide is repeatedly used, it is not necessary to perform a regeneration treatment or the like.

As the shape of the heat-resistant material (B), a plate-like shape can be suitably used when the porous molded body (A) is loaded. Furthermore, from the viewpoint that the occurrence of "soot" due to leakage of melted resin components to the outside can be suppressed, the loading surface of the heat-resistant material (B) is preferably larger than the bottom area of the porous molded body (A). The thickness of the heat-resistant material (B) is suitably about 10 to 60 mm.

EXAMPLES

Hereinafter, embodiments of the recovery method of the present invention will be described with reference to Examples, but the present invention is not limited to the following embodiments and the like, and can be implemented with an arbitrary modification without departing from the gist of the present invention.

Note that the shelf board used in the present invention has heat resistance, and may be any aspect as long as it is capable of heating the loaded photovoltaic module (X), porous molded body (A), and heat-resistant material (B). Examples thereof include ceramic shelf boards and wire meshes.

Example 1

As the photovoltaic module (X), an experiment was conducted using a polycrystalline silicon photovoltaic module with an aluminum frame, "PORTABLE SOLAR CHARGING KIT MODEL: SY-M5W" (290 mm×188 mm) manufactured by SUNYO. The electrodes attached to the back sheet were removed using a flat-bladed screwdriver and a hammer before the heating combustion experiment such that the glass was not damaged. Note that the back sheet of this photovoltaic module (X) had a three-layer structure with a thickness of 270 μm, and 90% by mass of the constituents was PET.

For the ceramic filter as the porous molded body (A), FCF-2 (made of silicon carbide) 10 ppi 200 mm×200 mm×27.5 mmt (vacancy ratio: 87%) manufactured by SEISEN FILTER was used. This ceramic filter was cut into (1) 150 mm×200 mm×27.5 mmt and (2) 50 mm×150 mm×27.5 mmt by water jet processing.

Wako 1st Grade chromium(III) oxide (manufactured by FUJIFILM Wako Pure Chemical Corporation) was stirred while suspended in water, and the two ceramic filters of (1) to be used at the lower stage were immersed to perform dip coating and dried at 450° C. The masses before coating were 345 g and 348 g, and the masses after coating and drying were 410 g and 421 g.

On a 330 mm square ceramic shelf board, these two ceramic filters coated with chromium(III) oxide were used and a 300 mm×200 mm×27.5 mmt ceramic filter was installed at the lowest stage. At the middle stage above it, a 250 mm×150 mm×27.5 mmt ceramic filter was installed by using the ceramic filters (1) and (2). Furthermore, on top of it, the photovoltaic module (X) was installed with the back sheet facing down. At this time, the ceramic filter at the middle stage was completely fitted inside the aluminum frame of the photovoltaic module (X) (see FIG. 1).

An electric furnace was used as the heating furnace. The electric furnace used was Roller Hearth Kiln with a furnace length of 12.6 m, a furnace width of 350 mm, and a furnace height of 150 mm. Into the electric furnace, 200 l/min of air was sent from the lower side. The temperature rise was set to 450° C. and it took 20 minutes to reach 450° C. The temperature was retained at 450° C. for 20 minutes and cooled for 90 minutes until it reached room temperature. Approximately 30 minutes after the start of heating, spontaneous ignition occurred and stable flaming combustion continued for 10 minutes. After thermal decomposition, the glass could be recovered without breaking, and the cell and inorganic powder could also be recovered. Furthermore, attachment of "soot" was not observed in the ceramic filter at the lowest stage, which was used as the heat-resistant material (B).

Example 2

Wako 1st Grade iron(III) oxide (manufactured by FUJIFILM Wako Pure Chemical Corporation) was stirred while suspended in water, and the two ceramic filters of (1) were immersed to perform dip coating and dried at 450° C. The masses before coating were 341 g and 338 g, and the masses after coating and drying were 399 g and 402 g.

Except that these two ceramic filters coated with iron(III) oxide were used instead of the ceramic filters coated with chromium(III) oxide at the lowest stage, the heat treatment was performed with Roller Hearth Kiln in the same manner as in Example 1. Approximately 30 minutes after the start of heating, spontaneous ignition occurred and stable flaming combustion continued for 10 minutes. After thermal decomposition, the glass could be recovered without breaking, and the cell and inorganic powder could also be recovered. Furthermore, attachment of "soot" was not observed in the ceramic filter at the lowest stage, which was used as the heat-resistant material (B).

Example 3

Guaranteed Reagent titanium(IV) oxide (manufactured by FUJIFILM Wako Pure Chemical Corporation) rutile type was stirred while suspended in water, and the two ceramic filters of (1) were immersed to perform dip coating and dried at 450° C. The masses before coating were 351 g and 357 g, and the masses after coating and drying were 407 g and 417 g.

Except that these two ceramic filters coated with titanium (IV) oxide were used instead of the ceramic filters coated with chromium(III) oxide at the lowest stage, the heat treatment was performed with Roller Hearth Kiln in the same manner as in Example 1. Approximately 30 minutes after the start of heating, spontaneous ignition occurred and stable flaming combustion continued for 10 minutes. After thermal decomposition, the glass could be recovered without breaking, and the cell and inorganic powder could also be recovered. Furthermore, attachment of "soot" was not observed in the ceramic filter at the lowest stage, which was used as the heat-resistant material (B).

Example 4

Practical Grade copper(II) oxide (manufactured by FUJIFILM Wako Pure Chemical Corporation) was stirred while suspended in water, and the two ceramic filters of (1) were immersed to perform dip coating and dried at 450° C. The masses before coating were 343 g and 349 g, and the masses after coating and drying were 408 g and 412 g.

Except that these two ceramic filters coated with copper (II) oxide were used instead of the ceramic filters coated with chromium(III) oxide at the lowest stage, the heat treatment was performed with Roller Hearth Kiln in the same manner as in Example 1. Approximately 30 minutes after the start of heating, spontaneous ignition occurred and stable flaming combustion continued for 10 minutes. After thermal decomposition, the glass could be recovered without breaking, and the cell and inorganic powder could also be recovered. Furthermore, attachment of "soot" was not observed in the ceramic filter at the lowest stage, which was used as the heat-resistant material (B).

Example 5

Except that two ceramic filters of (1) were used instead of the ceramic filters coated with chromium(III) oxide at the lowest stage, the heat treatment was performed with Roller Hearth Kiln in the same manner as in Example 1. Spontaneous ignition occurred 10 minutes after reaching 450° C., and stable flaming combustion continued for about 10 minutes. After thermal decomposition, the glass could be recovered without breaking, and the cell and inorganic powder could also be recovered. However, attachment of "soot" was observed in the ceramic filter at the lowest stage.

Example 6

As the photovoltaic module (X), an experiment was conducted using a polycrystalline silicon photovoltaic module with an aluminum frame, "PORTABLE SOLAR CHARGING KIT MODEL: SY-M30W-12" (510 mm×510 mm) manufactured by SUNYO. The electrodes attached to the back sheet were removed using a flat-bladed screwdriver and a hammer before the heating combustion experiment such that the glass was not damaged. Note that the back sheet of this photovoltaic module (X) had a three-layer structure with a thickness of 270 μm, and 90% by mass of the constituents was PET.

The same ceramic filter as in Example 1 was used as the porous molded body (A). Multiple ceramic filters were cut by water jet processing to obtain (3) 60 mm×200 mm×27.5 mmt, (4) 120 mm×200 mm×27.5 mmt, (5) 60 mm×60 mm×27.5 mmt, and (6) 120 mm×120 mm×27.5 mmt. Note that the size before cutting is (7) 200 mm×200 mm×27.5 mmt.

On a 600 mm square iron shelf board, by using four ceramic filters (4) and (7) each, and one ceramic filter (6), a 520 mm×520 mm×27.5 mmt ceramic filter carrying chromium oxide in the same manner as in Example 1 was installed at the lowest stage. At the middle stage above it, a 460 mm×460 mm×27.5 mmt ceramic filter was installed by using four ceramic filters (3) and (7) each, and one ceramic filter (5).

Furthermore, on top of it, the photovoltaic module (X) was installed with the back sheet facing down. At this time, the ceramic filter at the middle stage was completely fitted inside the aluminum frame of the photovoltaic module (X).

As the heating furnace, a high-speed hot air circulation furnace having a furnace width of 650 mm, a depth of 650 mm, and a furnace height of 1,000 mm was used. From the lower side of the furnace, 260 l/min of a combustion gas, city gas, was sent. For the temperature measurement, measurement was performed by inserting a thermocouple type thermometer into the center of the upper part of the ceramic filter at the middle stage. It took 8 minutes from the start of heating to 450° C., and after 9 minutes, heat generation due to the combustion reaction was observed, and after 11.8 minutes, the temperature rose to a maximum of 551° C. Then, after 18.6 minutes, it dropped to 450° C. After 20 minutes, the heating furnace was opened and the shelf board loading the photovoltaic module (X) and ceramic filters was taken out. After thermal decomposition, the glass could be recovered without breaking, and the cell and inorganic powder could also be recovered. Furthermore, attachment of "soot" was not observed in the ceramic filter at the lowest stage, which was used as the heat-resistant material (B).

Note that, as for the state of "flaming combustion" in this Example, the result is not described because the inside cannot be easily confirmed due to the structure of the heating furnace used.

Comparative Example 1

The photovoltaic module (X) was installed on a 330 mm square ceramic shelf board with the back sheet facing down, and no ceramic filter was used. Except the above, the heat treatment was performed with Roller Hearth Kiln in the same manner as in Example 1. Approximately 30 minutes after the start of heating, spontaneous ignition occurred and the module was combusted with black smoke emitted. Although the glass did not break, the unburned resin remained, and the cell and inorganic powder could not be recovered. In addition, attachment of a large amount of "soot" was observed on the ceramic shelf board.

Comparative Example 2

The heat treatment was performed with Roller Hearth Kiln in the same manner as in Comparative Example 1 except that the photovoltaic module (X) was installed with the back sheet facing up. Approximately 30 minutes after the start of heating, spontaneous ignition occurred and the module was combusted violently. Although the glass did not break after thermal decomposition, the cell and inorganic powder were fully covered with "soot" and difficult to recover. In addition, attachment of a large amount of "soot" was observed on the ceramic shelf board.

Comparative Example 3

On the back sheet of the photovoltaic module (X) in Comparative Example 2, a 150 mm×250 mm×27.5 mmt ceramic filter was installed by using the ceramic filters (1) and (2). At this time, the ceramic filter was completely fitted inside the aluminum frame of the photovoltaic module. Except the above, the heat treatment was performed with Roller Hearth Kiln in the same manner as in Comparative Example 2. Approximately 30 minutes after the start of heating, spontaneous ignition occurred and the module was combusted violently. Although the glass did not break after thermal decomposition, the cell and inorganic powder were fully covered with "soot" and difficult to recover. In addition, attachment of a large amount of "soot" was observed on the upper part of the ceramic filter and on the ceramic shelf board.

Comparative Example 4

Wako 1st Grade chromium(III) oxide (manufactured by FUJIFILM Wako Pure Chemical Corporation) was stirred while suspended in water, and the two ceramic filters of (1) were immersed to perform dip coating and dried at 450° C. The masses before coating were 339 g and 350 g, and the masses after coating and drying were 400 g and 416 g. Except that these two ceramic filters coated with chromium (III) oxide were installed on the ceramic filter in Comparative Example 3, the heat treatment was performed with Roller Hearth Kiln in the same manner as in Comparative Example 3 (see FIG. 2). Approximately 30 minutes after the start of heating, spontaneous ignition occurred and the module was combusted violently. Although the glass did not break after thermal decomposition, the cell and inorganic powder were fully covered with "soot" and difficult to recover. Note that attachment of "soot" was not observed on the ceramic filter and on the ceramic shelf board.

Comparative Example 5

Wako 1st Grade chromium(III) oxide (manufactured by FUJIFILM Wako Pure Chemical Corporation) was stirred while suspended in water, and the two ceramic filters of (1) and (2) were immersed to perform dip coating and dried at 450° C. The masses before coating were 339 g and 115 g, and the masses after coating and drying were 430 g and 155 g. These two ceramic filters coated with chromium(III) oxide were installed on the back sheet of the photovoltaic module (X) in Comparative Example 2. At this time, the ceramic filter carrying chromium(III) oxide was completely fitted inside the aluminum frame of the photovoltaic module. Furthermore, on top of it, a 300 mm×200 mm×27.5 mmt ceramic filter was installed by using two ceramic filters (1). Except the above, the heat treatment was performed with Roller Hearth Kiln in the same manner as in Comparative Example 2. Approximately 30 minutes after the start of heating, spontaneous ignition occurred and the module was combusted violently. Although the glass did not break after thermal decomposition, the cell and inorganic powder were fully covered with "soot" and difficult to recover. Note that attachment of "soot" was not observed on the ceramic filter and on the ceramic shelf board.

The results for each of the above Examples 1 to 6 and Comparative Examples 1 to 5 are summarized and shown in Table 1.

TABLE 1

| | Lowest stage | Middle stage | Upper stage | Flaming combustion | Soot |
|---|---|---|---|---|---|
| Example 1 | $Cr_2O_3CF$ | CF | Photovoltaic module | Stable | Excellent |
| Example 2 | $Fe_2O_3CF$ | CF | Photovoltaic module | Stable | Excellent |
| Example 3 | $TiO_2CF$ | CF | Photovoltaic module | Stable | Excellent |
| Example 4 | CuOCF | CF | Photovoltaic module | Stable | Excellent |
| Example 5 | CF | CF | Photovoltaic module | Stable | Good |
| Example 6 | $Cr_2O_3CF$ | CF | Photovoltaic module | — | Excellent |
| Comparative Example 1 | Photovoltaic module | | | Smoky combustion | Bad |
| Comparative Example 2 | Photovoltaic module (opposite) | | | Violent | Poor |
| Comparative Example 3 | Photovoltaic module (opposite) | CF | — | Violent | Poor |
| Comparative Example 4 | Photovoltaic module (opposite) | CF | $Cr_2O_3CF$ | Violent | Poor |
| Comparative Example 5 | Photovoltaic module (opposite) | $Cr_2O_3CF$ | CF | Violent | Poor |

The abbreviations in the table are as follows.
CF: Ceramic filter
$Cr_2O_3CF$: Ceramic filter carrying chromium(III) oxide Fe₂O₃CF: Ceramic filter carrying iron(III) oxide
TiO₂CF: Ceramic filter carrying rutile type or anatase type titanium(IV) oxide
CuOCF: Ceramic filter carrying copper(II) oxide Photovoltaic: Photovoltaic module (X) with the back sheet surface facing down
Photovoltaic (opposite): Photovoltaic module (X) with the back sheet facing up The evaluation criteria for "soot" in the table are as follows.

Excellent: Almost no soot is observed on the photovoltaic module or ceramic filter.
Good: Almost no "soot" is observed on the photovoltaic module (X), but a small amount of "soot" is attached to the ceramic filter.
Poor: A considerable amount of "soot" is attached to the photovoltaic module (X) and the ceramic filter.
Bad: A considerable amount of "soot" was attached to the photovoltaic module (X) and the ceramic filter, and a considerable amount of unburned residue derived from the resin components such as the back sheet of the photovoltaic module (X) remained.

REFERENCE SIGNS LIST

1 Porous molded body (B) carrying transition metal oxide
2 Porous molded body (A)
3 Back sheet
4 Sealing resin layer (EVA)
5 Cell
6 Tempered glass
7 Photovoltaic module (X)
8 Shelf board or wire mesh
9 Gas furnace or electric furnace

The invention claimed is:

1. A method of recovering valuable materials from a photovoltaic module, the method comprising:
   a loading step of loading a photovoltaic module (X) having a resin back sheet and a sealing resin layer on a heat-resistant porous molded body (A) with the back sheet surface facing down; and
   a heating step of heating a load including the photovoltaic module (X) and the porous molded body (A) in a heating furnace in an oxidizing atmosphere to melt and then combust the resin components,
   wherein a heat-resistant material (B) carrying a transition metal oxide is arranged in the heating furnace and the porous molded body (A) on which the photovoltaic module (X) is loaded is loaded on the heat-resistant material (B).

2. The method according to claim 1, wherein the heat-resistant material (B) is a porous molded body.

3. The method according to claim 2, wherein at least a part of the resin constituting the back sheet is an aromatic resin.

4. The method according to claim 2, wherein the transition metal oxide is an oxide of a first transition element to a third transition element.

5. The method according to claim 2, wherein the valuable materials are at least one selected from the group consisting of glass, cell, silver, and aluminum frame.

* * * * *